(12) United States Patent
Chang et al.

(10) Patent No.: US 8,169,760 B2
(45) Date of Patent: May 1, 2012

(54) SIGNAL AND POWER SUPPLY INTEGRATED ESD PROTECTION DEVICE

(75) Inventors: Shunhua T. Chang, South Burlington, VT (US); Kiran V. Chatty, Williston, VT (US); Robert J. Gauthier, Jr., Hinesburg, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 315 days.

(21) Appl. No.: 12/355,889

(22) Filed: Jan. 19, 2009

(65) Prior Publication Data

US 2010/0181621 A1    Jul. 22, 2010

(51) Int. Cl.
*H02H 9/00*     (2006.01)
*H02H 3/22*     (2006.01)
*H02H 3/20*     (2006.01)

(52) U.S. Cl. ........ 361/56; 361/111; 361/91.1; 361/91.5

(58) Field of Classification Search ............ 361/56, 361/111, 91.1, 91.5
See application file for complete search history.

(56) References Cited

U.S. PATENT DOCUMENTS

| | | | |
|---|---|---|---|
| 4,996,626 A | 2/1991 | Say | |
| 5,850,095 A | 12/1998 | Chen et al. | |
| 6,075,686 A * | 6/2000 | Ker | 361/56 |
| 6,400,204 B1 | 6/2002 | Davis | |
| 6,444,404 B1 * | 9/2002 | Chen et al. | 430/314 |
| 6,472,286 B1 | 10/2002 | Yu | |
| 6,512,662 B1 | 1/2003 | Wang | |
| 6,710,990 B2 * | 3/2004 | Walker et al. | 361/56 |
| 6,720,625 B2 | 4/2004 | Yu | |
| 6,891,230 B2 | 5/2005 | Yu | |
| 7,215,005 B2 | 5/2007 | Yu | |
| 2002/0084491 A1 | 7/2002 | Lee et al. | |

OTHER PUBLICATIONS

International Search Report and Writton Opinion for corresponding International Application No. PCT/EP2009/066301.
Salcedo et al., "Computer-aided design . . . protection applications", IEEE, Apr. 26-28, 2006, p. 6.

* cited by examiner

*Primary Examiner* — Jared Fureman
*Assistant Examiner* — Lucy Thomas
(74) *Attorney, Agent, or Firm* — Anthony Canale; Roberts Mlotkowski Safran & Cole, P.C.

(57) ABSTRACT

An integrated circuit, design structures and methods of forming the integrated circuit which includes a signal pad ESD coupled to an I/O signal pad and a power supply ESD coupled to a source VDD. The signal pad ESD and the power supply ESD are integrated in a single ESD structure.

27 Claims, 7 Drawing Sheets

SIGNAL AND POWER SUPPLY INTEGRATED ESD PROTECTION DEVICE

BACKGROUND

The invention relates to integrated circuits, and more particularly, to an input/output (I/O) signal pad electrostatic discharge (ESD) protection and power supply ESD protection.

Diode and power supply clamps are used as the main workhorse for electrostatic discharge (ESD) protection. However, drastic scaling of technology and decreasing oxide thickness make the known methods insufficient; as it produces a relatively high clamping voltage at the I/O pad.

As electronic components become smaller and smaller along with the internal structures in integrated circuits, it is becoming easier to either completely destroy or otherwise impair electronic components. In particular, many integrated circuits are highly susceptible to damage from the discharge of static electricity, even at levels which can neither be seen nor felt. This is typically referred to as ESD, in which the transfer of an electrostatic charge occurs between bodies at different electrostatic potentials (voltages) caused by direct contact or induced by an electrostatic field.

The discharge of static electricity, or ESD, has become a critical problem for the electronics industry. Device failures are not always immediately catastrophic, but often the device is weakened thus less able to withstand normal operating stresses and, hence, may result in a reliability problem. Therefore, various ESD protection circuits must be included in the device to protect the various components, with various considerations necessary for ESD protection circuits.

ESD protection is needed on all pins going to the outside world. While it is a normal strategy to have I/O signal pad ESD protection and power supply ESD protection for digital supplies, because some smaller isolated power supplies may only service small sections of the IC, the overhead of these power supply ESD devices can cause the size of these isolated logic blocks to increase significantly.

Accordingly, there exists a need in the art to overcome the deficiencies and limitations described hereinabove.

SUMMARY

According to an aspect of the invention, a design structure is embodied in a machine readable medium for designing, manufacturing, or testing an integrated circuit. The design structure includes a signal pad ESD coupled to an I/O signal pad and a power supply ESD coupled to a source VDD. The signal pad ESD and the power supply ESD are integrated in a single ESD structure.

According to an aspect of the invention, a design structure is embodied in a machine readable medium for designing, manufacturing, or testing an integrated circuit. The design structure includes an integrated ESD structure including a signal pad ESD and a power supply ESD.

According to an aspect of the invention, a design structure is embodied in a machine readable medium for designing, manufacturing, or testing an integrated circuit. The design structure includes a single ESD structure arranged to compensate for ESD stress combinations including a positive mode from pin-to-ground; a positive mode from pin-to-VDD; a negative mode from pin-to-ground; a negative mode from pin-to-VDD; a positive mode from VDD-to-ground; and a negative mode from VDD-to-ground.

According to an aspect of the invention, a design structure is embodied in a machine readable medium for designing, manufacturing, or testing an integrated circuit. The design structure includes a single electrostatic discharge (ESD) structure coupled to a signal pad and to a source VDD.

According to an aspect of the invention, an integrated circuit comprises a single electrostatic discharge (ESD) structure connectable to a signal pad and to a source VDD.

According to an aspect of the invention, a method is provided for forming an electrostatic discharge (ESD) protection device. The method includes integrating a signal pad ESD and a power supply ESD into a single ESD structure, coupling the signal pad ESD to an I/O signal pad, and coupling the power supply ESD to a source VDD.

According to an aspect of the invention, a method for protecting an integrated circuit from electrostatic discharge (ESD) includes integrating in a single structure an ESD protection device compensates for ESD stress combinations that includes at least one of a positive mode from pin-to-ground; a positive mode from pin-to-VDD; a negative mode from pin-to-ground; a negative mode from pin-to-VDD; a positive mode from VDD-to-ground; and a negative mode from VDD-to-ground.

According to an aspect of the invention, a method for protecting circuits from electrostatic discharge (ESD) includes coupling the circuits to an I/O signal pad and to a source Vdd, and coupling an integrated ESD structure to the I/O signal pad and to the source Vdd. The integrated ESD structure compensates for ESD stress combinations of a positive mode from pin-to-ground; a positive mode from pin-to-VDD; a negative mode from pin-to-ground; a negative mode from pin-to-VDD; a positive mode from VDD-to-ground; and a negative mode from VDD-to-ground.

According to an aspect of the invention, a method for protecting circuits from electrostatic discharge (ESD) with a single ESD structured includes coupling the single ESD structure to an I/O signal pad, and coupling the single ESD structured to a source VDD.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits, and more particularly, to a design structure for input/output (I/O) signal pad electrostatic discharge (ESD) protection and power supply ESD protection for analog supplies.

According to embodiments of the invention, the signal pad ESD protection and the power supply ESD protection can be integrated into one ESD structure that leads to significant ESD device area savings for analog cores. Further, the power supplies can be any small isolated power supplies. Moreover, an integrated ESD structure is provided for each signal pin on an integrated chip.

Figure 1:
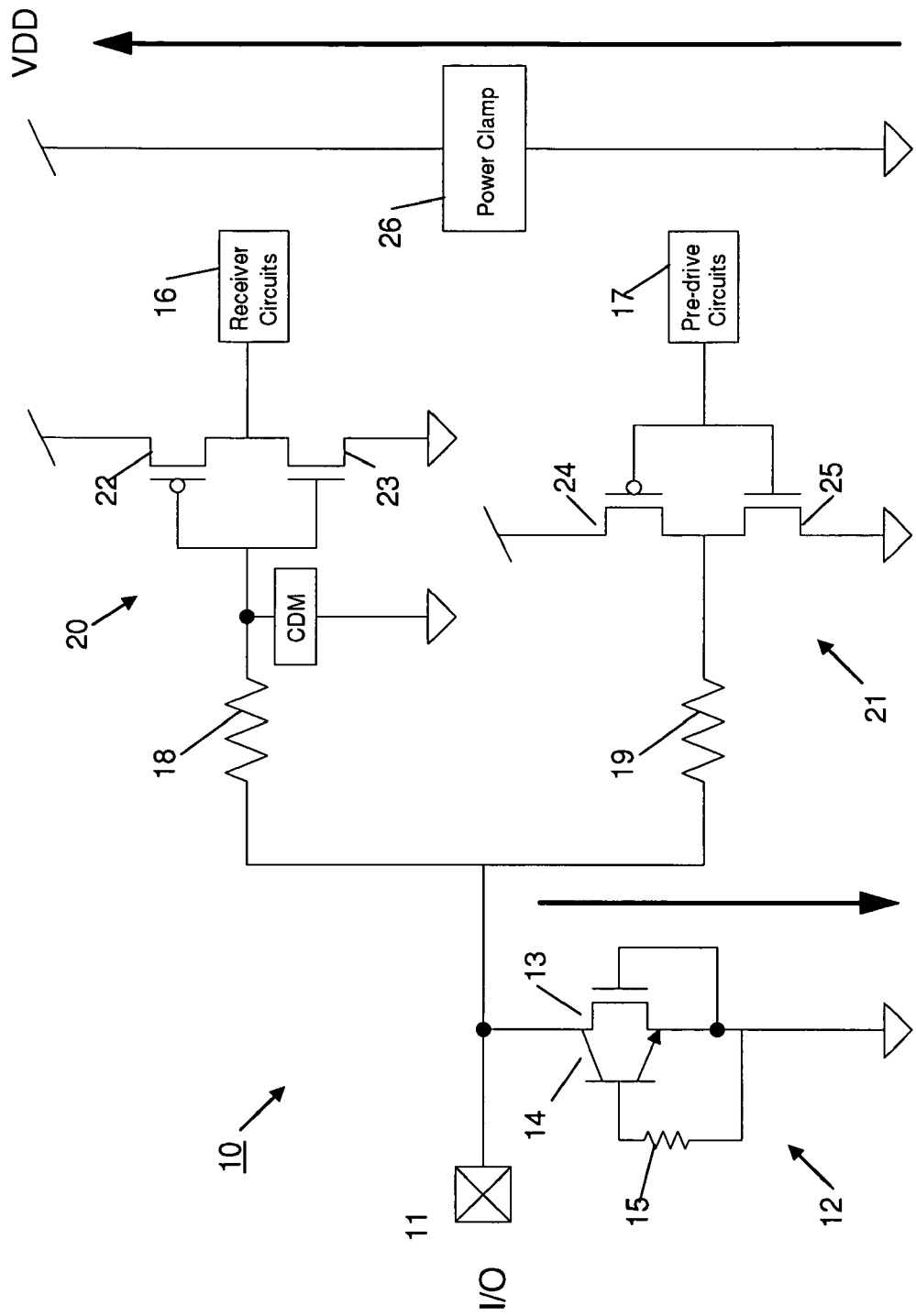
FIG. 1 illustrates a grounded gate n-type metal oxide semiconductor (GGNMOS) and power clamp protection scheme.

A grounded gate n-type metal oxide semiconductor (GGNMOS) and power clamp protection scheme 10 is illustrated in FIG. 1. Input/output (I/O) pad 11 is protected from electrostatic discharge by GGNMOS 12. GGNMOS 12 includes an nMOS field effect transistor (FET) 13 coupled in parallel with a bipolar transistor 14. The collector of bipolar transistor 14 and the source of n-type MOSFET 13 are coupled to the I/O pad, and the emitter of bipolar transistor 14 and the drain of n-type MOSFET 13 are coupled to ground. Further, the gate of n-type MOSFET 13 is coupled to ground, while the base of transistor 14 is coupled to ground through a resistor 15. Further, the I/O pad is coupled to receiver circuits 16 and pre-drive circuits 17 through respective resistors 18, 19 and respective static inverters 20, 21. Moreover, inverter 20 can be formed by an upper FET 22 coupled to voltage (VDD) and a lower FET 23 coupled to ground. An inverted base of FET 22 and the base of FET 23 are coupled to resistor 18. Further, a charged device model (CDM) clamp can be coupled between the bases of FETs 22, 23 and ground to clamp high voltages from an ESD until the discharge can be dissipated through protective circuitry. A connection between the drain of FET 22 and source of FET 23 is coupled to receiver circuits 16. Inverter 21 can be formed by an upper FET 24 coupled to voltage (VDD) and a lower FET 25 coupled to ground. An inverted base of FET 24 and the base of FET 25 are coupled to pre-drive circuits 17, and a connection between the drain of FET 24 and source of FET 25 is coupled to resister 19.

As illustrated, a power clamp 26 is connected between VDD and ground to provide ESD protection for the receiver circuits 16 and pre-driver circuits 17. Thus, the integrated circuits require separate circuits for protecting against ESD, i.e., one circuit for protecting the I/O pad and one circuit for power supply protection.

However, it has been discovered that, for positive pin-to-VDD ESD stress, a long discharge path with ground resistance plays a key role. Further, ESD clamp power area increases the overall isolated circuit block size when both signal pad ESD protection and power supply ESD protection are provided to isolated circuit block circuits. Thus, the inventors have found it would be advantageous to reduce signal pad ESD and power supply ESD total area.

Figure 2:
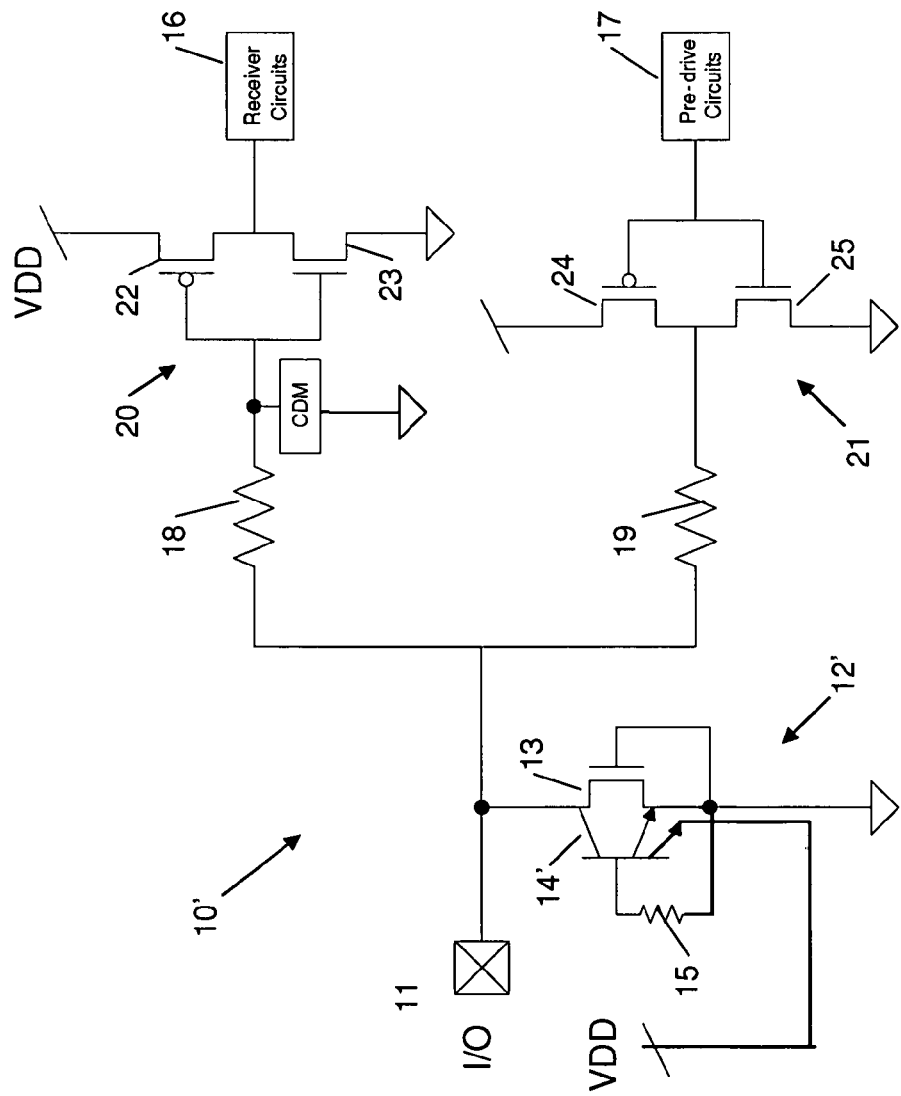
FIG. 2 illustrates an ESD structure in accordance with embodiments of the invention.

An embodiment of the invention is illustrated in FIG. 2, in which the signal pad ESD and power supply ESD are integrated together in a single circuit. However, it is noted that the arrangement illustrated in FIG. 2 generally corresponds to the arrangement depicted in FIG. 1, such that common elements are provided with the same reference numerals. In contrast to FIG. 1, which shows a power clamp 26 separate from GGNMOS 12, FIG. 2 illustrates a modification to the GGNMOS structure 10' shown in FIG. 1 to create an integrated ESD structure 12'. Integrated ESD structure 12' includes an nMOSFET 13 coupled in parallel to bipolar transistor 14'. The collector of bipolar transistor 14' and the source of nMOSFET 13 are coupled to the I/O signal pad, and the emitter of transistor 14 and a drain of nMOSFET 13' are coupled to ground. Further, the gate of nMOSFET 13 is coupled to ground, while the base of bipolar transistor 14 is coupled to ground through a resistor 15. A second emitter of bipolar transistor 14' is coupled to VDD.

The above-noted exemplary design of the integrated ESD 12', in addition to enabling pin to pin ESD paths, compensates for or covers six (6) ESD stress modes or combinations, i.e.:
(1) positive mode from pin-to-ground;
(2) positive mode from pin-to-VDD;
(3) negative mode from pin-to-ground;
(4) negative mode from pin-to-VDD;
(5) positive mode from VDD-to-ground; and
(6) negative mode from VDD-to-ground.

Embodiments of the invention utilize existing devices on the integrated circuit, e.g., GGNMOS, lateral NPN, diodes, lateral diffusion nMOS (LDNMOS), that are merged in order to implement the ESD protection design. Further, as is apparent from the illustration depicted in FIG. 2, the ESD structure design configuration according to embodiments of the invention do not require the area consuming power clamps utilized in the conventional arrangement of FIG. 1. By way of example, according to embodiments of the invention, a 30% ESD area reduction over the conventional design of FIG. 1 can be achieved in analog cores through integrating the ESD power supply and I/O signal pad protection. As a result, the exemplary ESD structure depicted in FIG. 2 provides improvement in certain discharge paths under different ESD stress modes over the conventional arrangement of FIG. 1 so that power bus restrictions from an ESD perspective are relaxed and/or eliminated.

Figure 3:
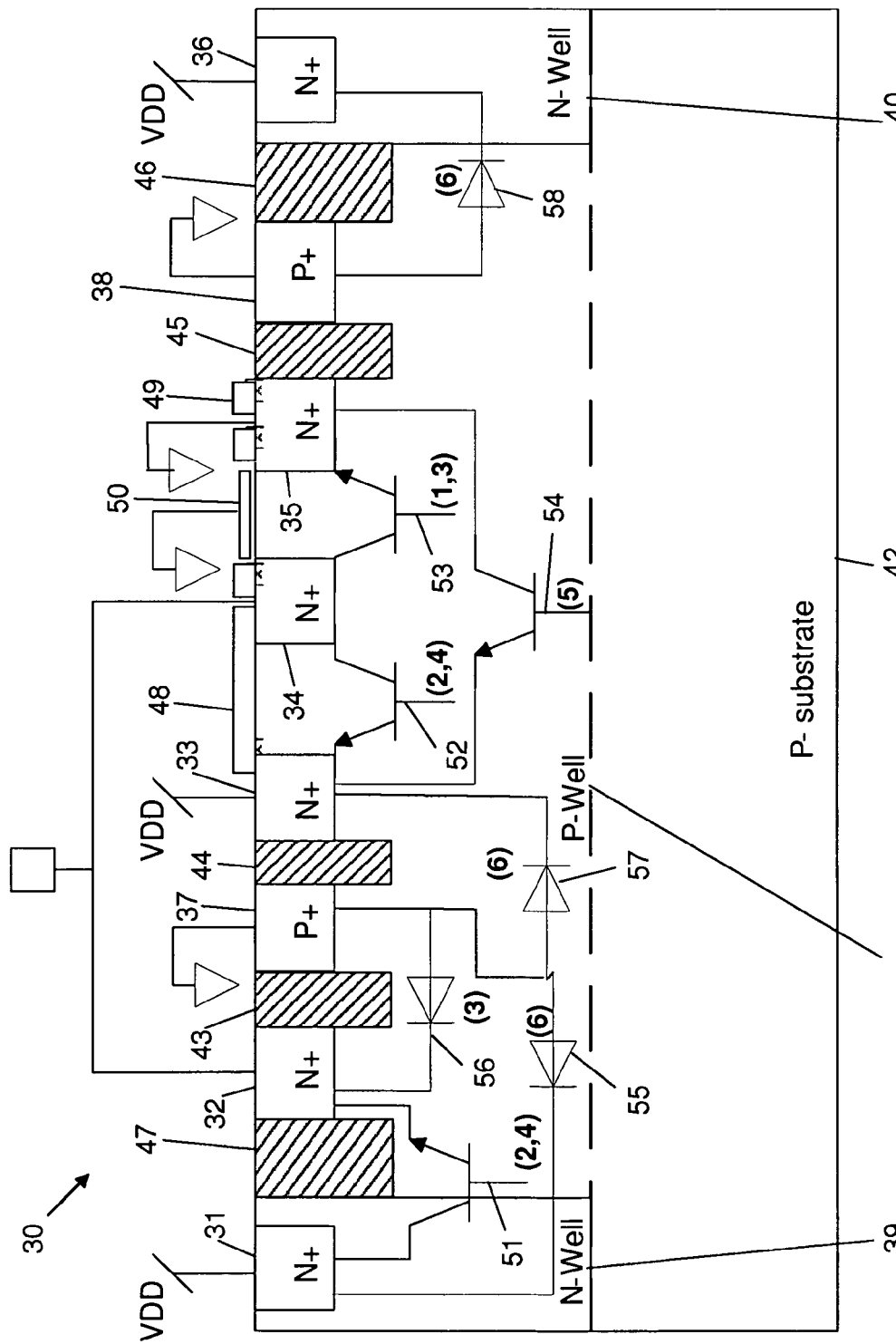
FIG. 3 illustrates a cross-sectional view of an ESD structure in accordance with embodiments of the invention.

FIG. 3 illustrates a cross-section of an exemplary ESD structure design formed on an integrated circuit 30. Integrated circuit 30 includes N+ regions 31-36 and P+ regions 37, 38. N+ regions 31, 36 can be formed in N-wells 39, 40, respectively, while the remaining N+ and P+ regions are formed in a P-well 41. P-well 41 and N-wells 39, 40 are formed on a p-substrate 42. The P+ regions 37, 38 are isolated from neighboring N+ regions by trenches 43-46 and an additional trench 47 is arranged to isolate N+ region 32 from N-well 39. A silicide blocking layer 48 is arranged to extend from N+ region 33 to N+ region 34, and another silicide blocking layer 49 can be arranged over N+ region 35. A poly gate 50 can be arranged between silicide blocking layers 48 and 49, and, therefore, between N+ regions 34, 35. In the depicted embodiment, poly gate 50 does not extend over N+ regions 34, 35.

As shown in the exemplary illustration, N+ regions 31, 33, 36 are connected to VDD, while P+ regions 37, 38, N+ region 35, and poly gate 50 are connected to ground. The connection of poly gate 50 to ground creates a source and drain self-aligned to poly gate 50. N+ regions 32, 34 are connected to I/O pad 11'. FIG. 3 further schematically illustrates the intrinsic devices formed in the semiconductor of the ESD structure described above. In this embodiment, transistors 51-54 can be formed between N+ regions 31, 32; N+ regions 33, 34; N+ regions 34, 35; and N+ regions 33, 35, and diodes 55-58 can be formed between N+ region 31, P+ region 37; N+ region 32, P+ region 37; N+ region 33, P+ region 37; and N+ region 36, P+ region 38. Further, next to each schematically illustrated circuit element are numbers corresponding to which of the above-noted six ESD stress modes are compensated for or covered by the intrinsic elements. Thus, by way of example, transistors 51, 52 provide a positive mode from pin-to-VDD and a negative mode from pin-to-VDD, while transistor 53 provides a positive mode from pin-to-ground and a negative mode from pin-to-ground, and transistor 54 provides a positive mode from VDD-to-ground. Further, diodes 55, 57, 58 provide a negative mode from VDD-to-ground, while diode 56 provides a negative mode from pin-to-ground.

Figure 4:
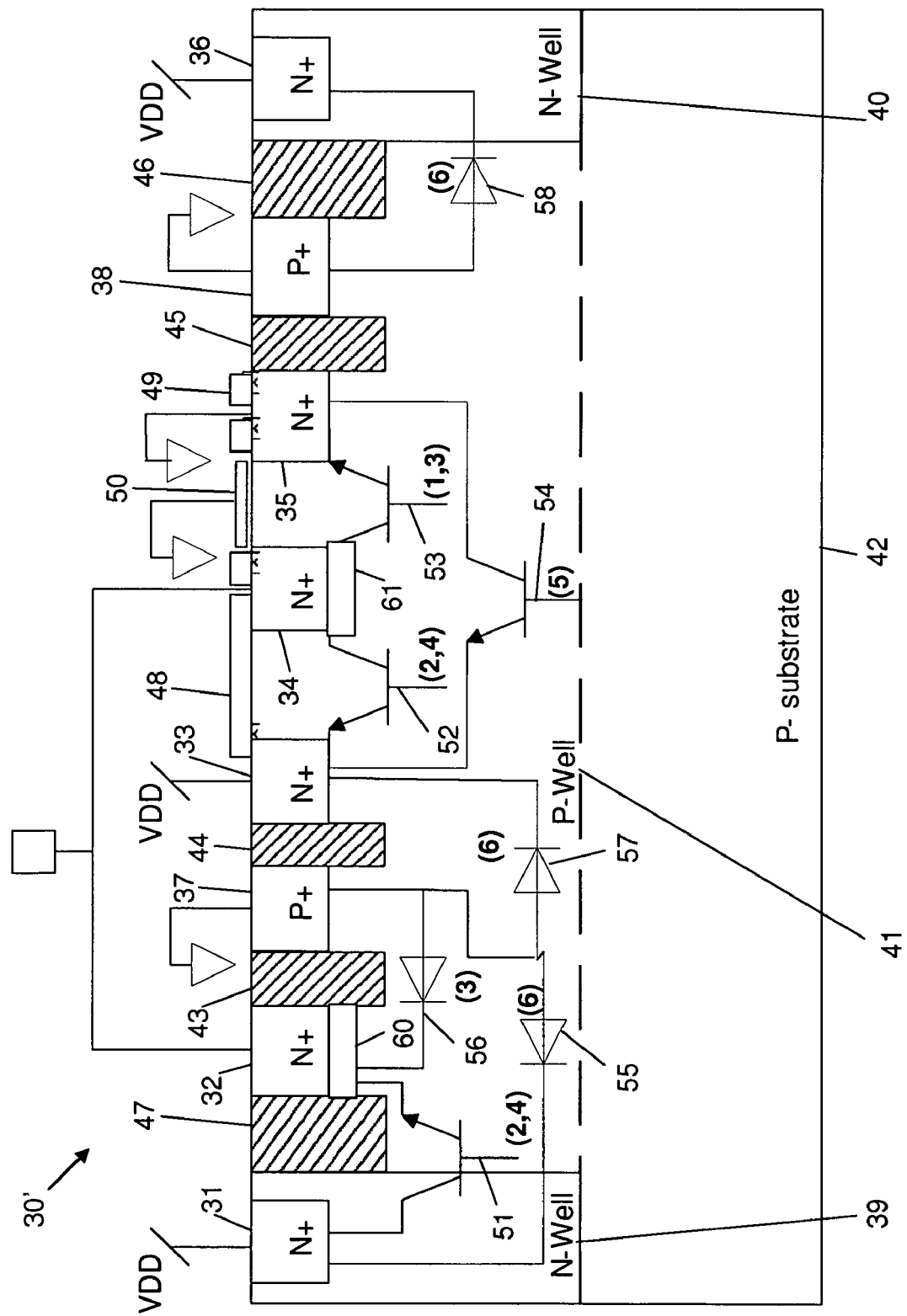
FIG. 4 illustrates a cross-sectional view of another ESD structure in accordance with embodiments of the invention.

According to other embodiments of the invention, FIG. 4 illustrates a cross-section of an exemplary ESD structure design formed on an integrated circuit 30', which is similar to the integrated circuit 30 depicted in FIG. 3. Accordingly, similar elements will be identified with the same reference numerals. As shown in FIG. 4, integrated circuit 30' includes ESD implant regions 60, 61 formed under N+ regions 32 and 34. ESD implant regions 60, 61 can be heavily doped P+ junctions provided to lower breakdown voltage, and therefore, form breakdown Zener diodes. According to this exemplary embodiment, under ESD conditions, the illustrated ESD structure clamps at a lower voltage to provide enhanced ESD protection.

Figure 5:
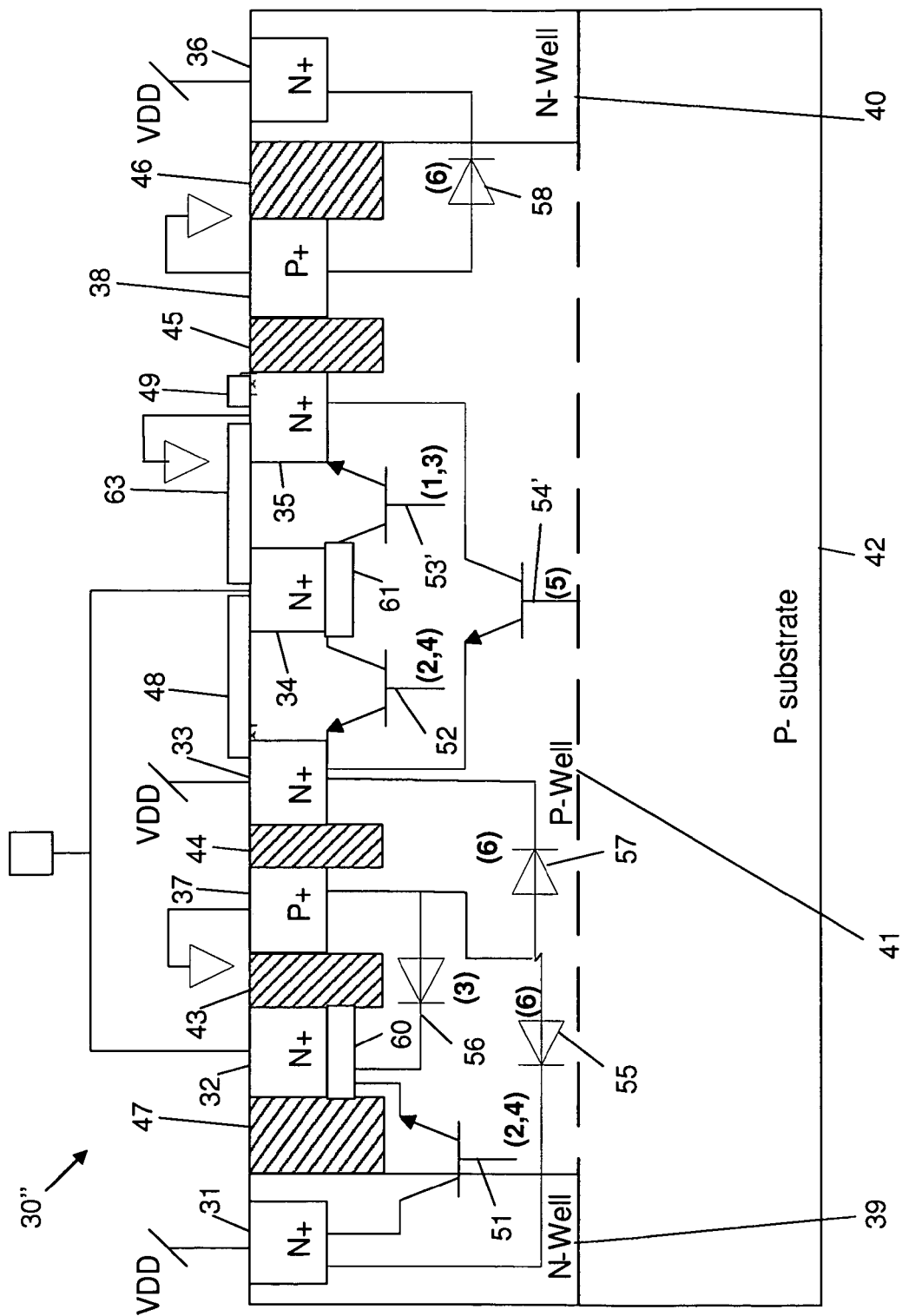
FIG. 5 illustrates a cross-sectional view of still another ESD structure in accordance with embodiments of the invention.

According to still other embodiments of the invention, FIG. 5 illustrates a cross-section of an exemplary ESD structure design formed on an integrated circuit 30'', which is similar to the integrated circuit 30' depicted in FIG. 4. Accordingly, similar elements will be identified with the same reference numerals. As shown in FIG. 5, a silicide blocking layer 63, e.g., a nitride layer, extending over and between N+ regions 34, 35. Silicide blocking layer 63 replaces poly gate 50 depicted in FIG. 4 in order to form non-self-aligned bipolar transistors 53' and 54'.

Figure 6:
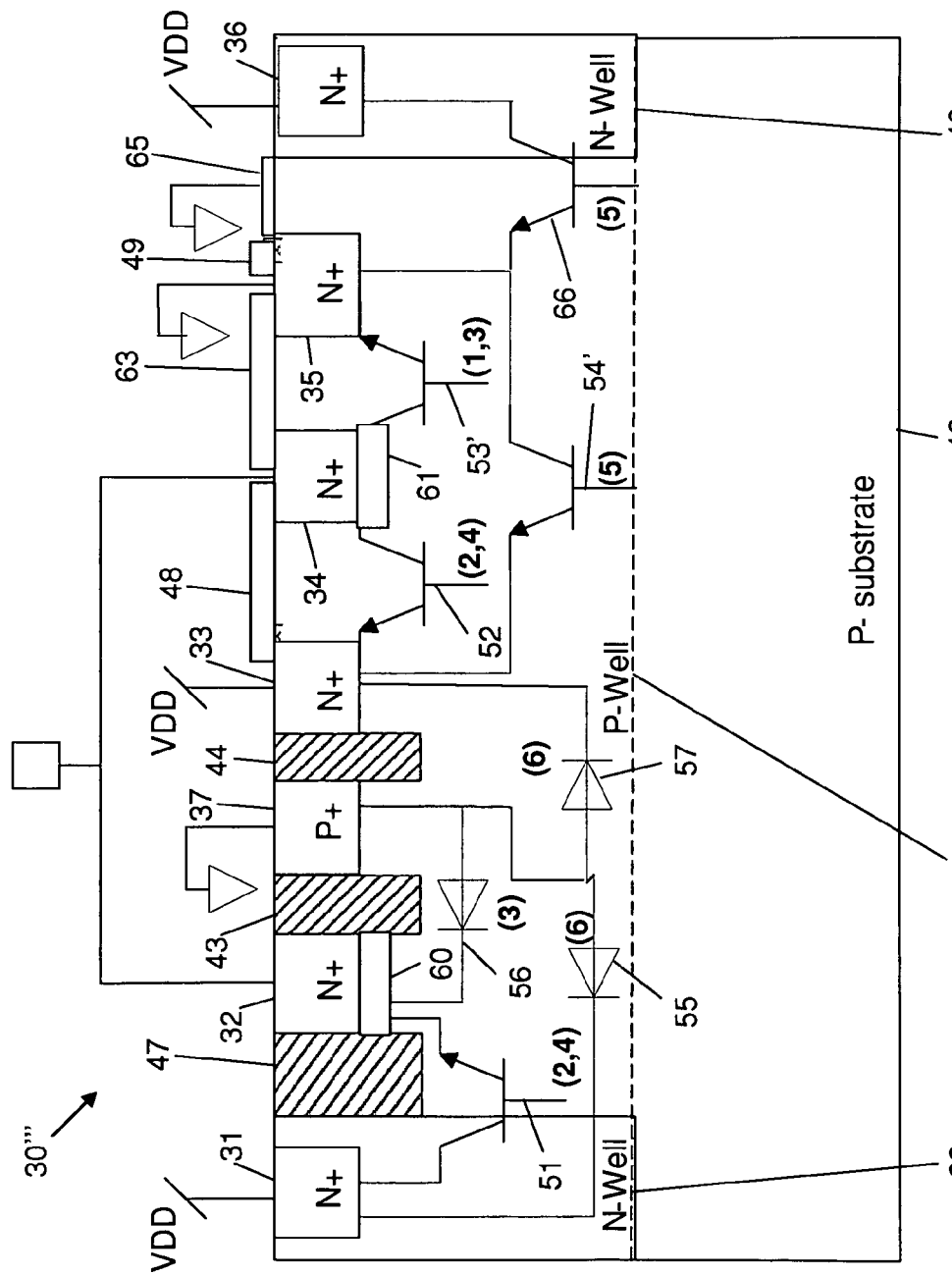
FIG. 6 illustrates a cross-sectional view of a further ESD structure in accordance with embodiments of the invention.

According to further embodiments of the invention, FIG. 6 illustrates a cross-section of an exemplary ESD structure design formed on an integrated circuit 30''', which is similar to the integrated circuit 30'' depicted in FIG. 5. Accordingly, similar elements will be identified with the same reference numerals. As shown in FIG. 6, P+ region 38 and therefore trenches 45 and 46 are not utilized in this exemplary design. Moreover, a poly gate 65 is arranged between N+ region 35 and N-well 40. In the depicted embodiment, poly gate 65 does not extend over N+ region 35 or N-well 40. As poly gate 65 is connected to ground, transistors with sources and drains self-aligned to the poly gate are formed.

Thus, according to the exemplary embodiment depicted in FIG. 6, a transistor 66 is formed between N+ regions 35, 36, and this transistor 66 replaces the diode 58 in the embodiment depicted in FIG. 5. Further, it is noted that transistor 66, like transistor 54, provides a positive mode from VDD-to-ground. In this manner, transistor 66 provides an improvement of discharging path.

The circuit as described above is part of the design for an integrated circuit chip. The chip design is created in a computer-aided electronic design system, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Figure 7:
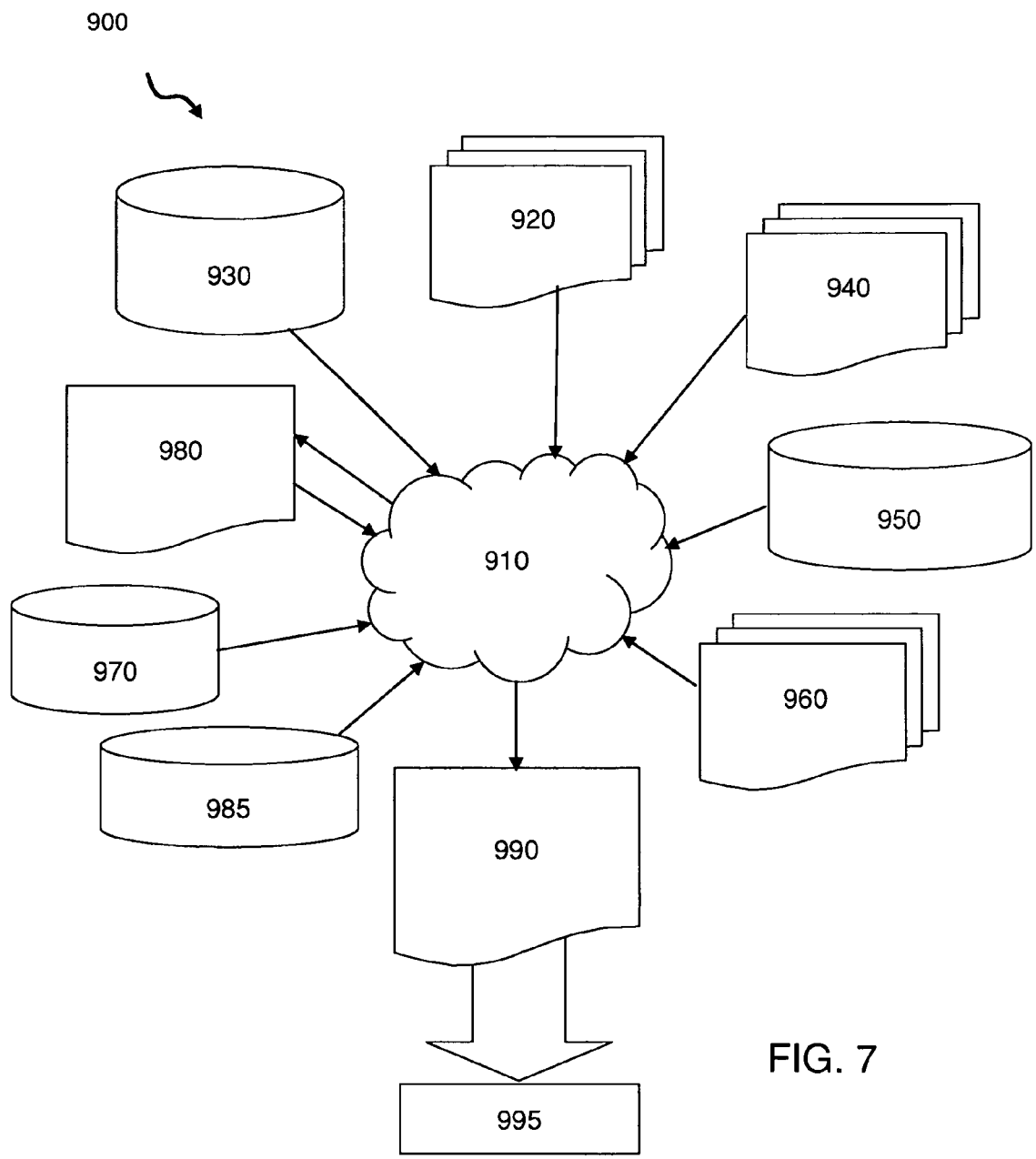
FIG. 7 is a flow diagram of a design process used in semiconductor design, manufacture, and/or test.

FIG. 7 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in, for example, FIGS. 2-6 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in, for example, FIGS. 2-6. Design process 910 preferably synthesizes (or translates) an embodiment of the invention as shown in, for example, FIGS. 2-6 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in, for example, FIGS. 2-6, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in, for example, FIGS. 2-6. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed:

1. A design structure that is tangibly embodied in a machine readable storage medium for designing, manufacturing, or testing an integrated circuit that when processed on a data processing system generates a functional representation of the integrated circuit, the design structure comprising:
   a signal pad electrostatic discharge (ESD) device coupled to an I/O signal pad; and
   a power supply ESD device coupled to a source VDD, wherein the signal pad ESD device and the power supply ESD device are integrated in a single ESD structure comprising:
      a FET coupled to a parasitic transistor;
      a collector of the parasitic transistor and a source of the FET coupled to the I/O signal pad;
      an emitter of the parasitic transistor and a drain and gate of the FET coupled to ground;
      a base of the parasitic transistor coupled to the ground through a resistor; and
      a second emitter of the parasitic transistor coupled to the source VDD.

2. The design structure in accordance with claim 1, the design structure being structured and arranged for analog cores.

3. The design structure in accordance with claim 1, wherein the single ESD structure is arranged to cover a plurality of ESD stress combinations, and the plurality of ESD stress combinations comprises:
   a positive mode from pin-to-ground;
   a positive mode from pin-to-VDD;
   a negative mode from pin-to-ground;
   a negative mode from pin-to-VDD;
   a positive mode from VDD-to-ground; and
   a negative mode from VDD-to-ground.

4. The design structure in accordance with claim 3, wherein the single ESD structure is arranged to cover each of the ESD stress combinations.

5. The design structure in accordance with claim 1, wherein the single ESD structure comprises at least one poly gate to form at least one self-aligning transistor.

6. The design structure in accordance with claim 1, wherein the single ESD structure comprises at least one silicide blocking layer to form at least one non-self-aligning transistor.

7. The design structure in accordance with claim 1, wherein the single ESD structure comprises an ESD implant region to form breakdown zener diodes.

8. The design structure of claim 1, wherein the FET is an nMOSFET and the transistor is a bipolar transistor.

9. An integrated circuit comprising:
   a single electrostatic discharge (ESD) structure connectable to a signal pad and to a source VDD comprising:
      a FET coupled to a parasitic transistor;
      a collector of the parasitic transistor and a source of the FET coupled to the I/O signal pad;
      an emitter of the parasitic transistor and a drain and gate of the FET coupled to ground,
      a base of the parasitic transistor coupled to the ground through a resistor; and
      a second emitter of the parasitic transistor coupled to the source VDD.

10. The integrated circuit in accordance with claim 9, further comprising at least one p-well and at least one n-well formed above a p-substrate.

11. The integrated circuit in accordance with claim 10, further comprising a plurality of n-regions and a plurality of p-regions in the at least one p-well and at least one n-region in the at least one n-well.

12. The integrated circuit in accordance with claim 10, further comprising at least three n-regions within the p-well, and a poly gate located adjacent to at least one of the three n-regions to form at least one self-aligning transistor.

13. The integrated circuit of claim 9, wherein the FET is an nMOSFET and the transistor is a bipolar transistor.

14. A method for forming an electrostatic discharge (ESD) protection device, comprising:
   integrating a signal pad ESD and a power supply ESD into a single ESD structure;
   coupling the signal pad ESD to an I/O signal pad; and
   coupling the power supply ESD to a source VDD, wherein
      a FET is coupled to a parasitic transistor,
      a collector of the parasitic transistor and a source of the FET are coupled to the I/O signal pad,
      an emitter of the parasitic transistor and a drain and gate of the FET are coupled to ground,
      a base of the parasitic transistor is coupled to the ground through a resistor, and
      a second emitter of the parasitic transistor is coupled to the source VDD.

15. The method for forming an electrostatic discharge (ESD) protection device of claim 14, wherein the FET is an nMOSFET and the transistor is a bipolar transistor.

16. A method for protecting an integrated circuit from electrostatic discharge (ESD), comprising:
   integrating in a single structure an ESD protection device compensating for ESD stress combinations comprising:
      a positive mode from pin-to-ground;
      a positive mode from pin-to-VDD;
      a negative mode from pin-to-ground;
      a negative mode from pin-to-VDD;

a positive mode from VDD-to-ground; and
a negative mode from VDD-to-ground,
wherein the integrating comprises:
coupling a collector of a dual-emitter bipolar transistor and a source of a FET to an I/O signal pad,
coupling a first emitter of the dual-emitter bipolar transistor and a drain and gate of the FET to the ground,
coupling a base of the dual-emitter bipolar transistor to the ground through a resistor, and
coupling a second emitter of the dual-emitter bipolar transistor to the VDD.

17. The method of claim 16, further comprising:
forming a plurality of N+ regions in a P-well, the plurality of N+ regions including a first N+ region, a second N+ region and a third N+ region, wherein:
the first N+ region comprises the second emitter of the dual-emitter bipolar transistor,
the second N+ region comprises the collector of the dual-emitter bipolar transistor, and
the third N+ region comprises the first emitter of the dual-emitter bipolar transistor.

18. The method of claim 17, further comprising:
arranging a silicide blocking layer extending from the first N+ region to second N+ region.

19. The method of claim 18, further comprising:
arranging a second silicide blocking layer over the third N+ region.

20. The method of claim 19, further comprising:
arranging a poly gate between the first silicide blocking layer and the second silicide blocking layer.

21. The method of claim 20, wherein the poly gate between the first silicide blocking layer and the second silicide blocking layer does not extend over the second and third N+ regions.

22. The method of claim 17, further comprising:
forming a heavily doped P+ junction under the second N+ region, wherein the heavily doped P+ junction forms a breakdown Zener diode.

23. The method of claim 17, further comprising:
arranging a poly gate between the second N+ region and the third of N+ region to form a non-self-aligned transistor.

24. The method of claim 17, wherein an N-well region is formed adjacent to the P-well region, and the method further comprises:
arranging a poly gate between the third N+ region and the N-well region, and connecting the poly gate to ground to form a transistor with a source and drain self-aligned to the poly gate.

25. A method for protecting circuits from electrostatic discharge (ESD), comprising:
coupling the circuits to an I/O signal pad and to a source VDD; and
coupling an integrated ESD structure to the I/O signal pad and to the source VDD, wherein the integrated ESD structure compensates for ESD stress combinations of a positive mode from pin-to-ground; a positive mode from pin-to-VDD; a negative mode from pin-to-ground; a negative mode from pin-to-VDD; a positive mode from VDD-to-ground; and a negative mode from VDD-to-ground,
wherein the coupling an integrated ESD structure to the I/O signal pad and to the source VDD comprises:
coupling a collector of a dual-emitter bipolar transistor and a source of a FET to the I/O signal pad,
coupling an emitter of the dual-emitter bipolar transistor and a drain and gate of the FET to the ground,
coupling a base of the dual-emitter bipolar transistor to the ground through a resistor, and
coupling a second emitter of the dual-emitter bipolar transistor to the source VDD.

26. A method for protecting circuits from electrostatic discharge (ESD) with a single ESD structure, comprising:
coupling the single ESD structure to an I/O signal pad; and
coupling the single ESD structure to a source VDD, wherein
a FET is coupled to a parasitic transistor,
a collector of the parasitic transistor and a source of the FET are coupled to the I/O signal pad,
an emitter of the parasitic transistor and a drain and gate of the FET are coupled to ground,
a base of the parasitic transistor is coupled to the ground through a resistor, and
a second emitter of the parasitic transistor is coupled to the source VDD.

27. The method for protecting circuits from electrostatic discharge (ESD) with a single ESD structure of claim 26, wherein the FET is an nMOSFET and the transistor is a bipolar transistor.

* * * * *